United States Patent [19]

Allgood et al.

[11] Patent Number: 4,508,983

[45] Date of Patent: Apr. 2, 1985

[54] MOS ANALOG SWITCH DRIVEN BY COMPLEMENTARY, MINIMALLY SKEWED CLOCK SIGNALS

[75] Inventors: Robert N. Allgood; Joe W. Peterson; Roger A. Whatley, all of Austin, Tex.

[73] Assignee: Motorola, Inc., Schaumburg, Ill.

[21] Appl. No.: 465,408

[22] Filed: Feb. 10, 1983

[51] Int. Cl.³ .................. H03K 17/16; H03K 17/687; H03K 19/096

[52] U.S. Cl. .................................. 307/577; 307/269; 307/443; 307/452; 307/579

[58] Field of Search .............. 307/443, 269, 451–453, 307/480–481, 352–353, 572, 576, 577, 579, 582–585, 591–592, 601, 605

[56] References Cited

U.S. PATENT DOCUMENTS

| | | | |
|---|---|---|---|
| 4,066,919 | 1/1978 | Huntington | 307/353 |
| 4,069,429 | 1/1978 | White et al. | 307/451 X |
| 4,198,580 | 4/1980 | Culmer | 307/577 |
| 4,361,769 | 11/1980 | Hatchett et al. | 307/353 |
| 4,393,318 | 7/1983 | Takahashi et al. | 307/577 X |
| 4,467,227 | 8/1984 | Lewyn et al. | 307/577 |
| 4,479,216 | 10/1984 | Krambeck et al. | 307/269 X |

*Primary Examiner*—Stanley D. Miller
*Assistant Examiner*—D. R. Hudspeth
*Attorney, Agent, or Firm*—Anthony J. Sarli, Jr.; Jeffrey Van Myers; Robert Lee King

[57] ABSTRACT

An MOS analog switch utilizing two transmission gates which are compensated by a third transmission gate is provided. The transmission gates may be either single or complementary conductivity type transmission gates and are controlled by complementary clock signals. A method and apparatus for minimizing clock skew thereby reducing error voltages caused by parasitic capacitance are provided.

12 Claims, 3 Drawing Figures

MOS ANALOG SWITCH DRIVEN BY COMPLEMENTARY, MINIMALLY SKEWED CLOCK SIGNALS

TECHNICAL FIELD

This invention relates generally to solid state switches and, more particularly, to an MOS analog switch having transmission gates which are compensated for associated parasitic capacitance.

BACKGROUND ART

Typically, MOS transmission gates utilize two transistors coupled in parallel to form input and output nodes and are controlled by a control signal. Such transmission gates are a source of error voltages created by parasitic capacitance associated therewith. A compensating transistor which is matched with the two parallel coupled transistors is typically connected to one of the input or output nodes of the two coupled transistors. The compensating transistor is controlled by a complement control signal. Due to a limitation of the amount of voltage which may by applied to current electrodes of the two transistors, a P-channel and an N-channel transistor are frequently used for each of the two transistors. Such a configuration is commonly referred to as a CMOS switch or transmission gate. Parasitic capacitance associated with the gate-source and gate-drain interface couples charge from the control signals to both an input and an output terminal of the transmission gate. Frequently, one of the input/output terminals is directly coupled to either a ground reference or to a voltage source in which case the parsitic charge coupling to a terminal connected in this manner does not produce an error. However, when an input/output terminal of a transmission gate is coupled to a high impedance, parasitic charge coupling to the high impedance node creates an error voltage. This error voltage is typically referred to as control signal feedthrough. Therefore, a compensating transmission gate which is substantially matched with the two transmission gates is connected to the compensated node of the two transmission gates and also controlled by the complementary control signals. The compensating device utilizes offsetting charge to limit an error voltage resulting from transients occurring during the switching action of the transmission gate. However, unless clock skew, the time of delay between the complementary control signals, is zero, total charge cancellation is not achieved resulting in an error voltage.

SUMMARY OF THE INVENTION

Accordingly, it is an object of the invention to provide an improved MOS analog switch.

Another object of the invention is to provide an improved analog switch having improved low error voltages.

Yet another object of the invention is to provide an improved CMOS switch which minimizes clock skew.

In carrying out the above and other objects of the present invention, there is provided, in one form a composite switch comprising three CMOS transmission gates. Two of the transmission gates are coupled in parallel and the third transmission gate is coupled to the first and second transmission gates to compensate for error voltages created by capacitance associated with the first and second transmission gates. In one form, all three transmission gates comprise CMOS devices which are controlled by a clock signal and its complement. The clock signal and complement thereof are provided by first and second inverter means which comprise CMOS devices. Clock skew is the time delay between a change of logic state between the clock signal and its complement and creates an error voltage by coupling charge resulting from parasitic capacitance. To minimize clock skew, the CMOS devices comprising the first and second inverter means are ratioed in a predetermined manner.

The above and other objects, features and advantages of the present invention will be more clearly understood from the following detailed description taken in conjunction with the accompanying drawings.

DESCRIPTION OF A PREFERRED EMBODIMENT

Figure 1:
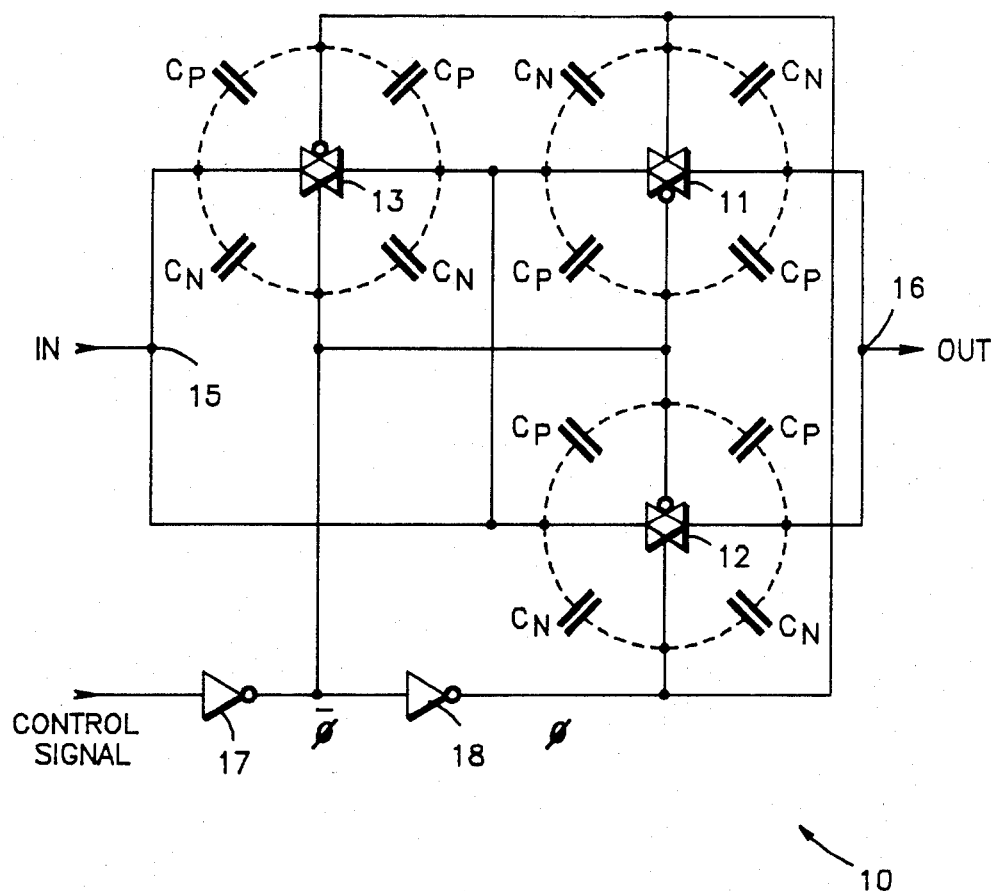
FIG. 1 illustrates in block diagram form an MOS analog switch constructed in accordance with a preferred embodiment of the present invention.

Shown in FIG. 1 is a composite CMOS analog switch 10 comprising transmission gates 11, 12 and 13. Transmission gates 11, 12 and 13 each have an input connected to an input terminal 15 of switch 10. An output terminal of transmission gate 13 is also connected to input terminal 15 so that a conductive path always exists between the input and output terminals of transmission gate 13. An output of transmission gate 11 is connected to an output of transmission gate 12 at an output terminal 16.

Although transmission gates 11, 12 and 13 are illustrated as CMOS transmission gates which are clocked in a conventional manner, transmission gates 11, 12 and 13 may also comprise devices of single conductivity type (e.g. PMOS or NMOS). In such an embodiment, transmission gates 11, 12 and 13 comprise only one transistor each and the structure of switch 10 remains the same as illustrated in FIG. 1. Complementary control signals are utilized to clock transmission gates 11 and 12 and transmission gate 13, respectively.

Figure 2:
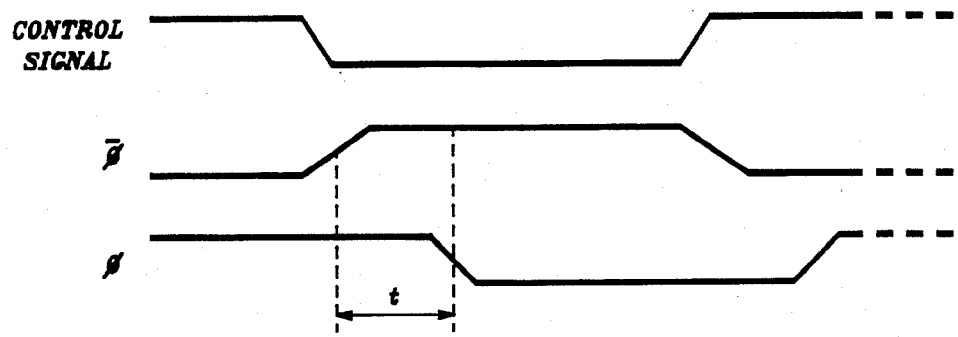
FIG. 2 illustrates in graphical form clock skew associated with the switch of FIG. 1.

In the illustrated form, each transmission gate of FIG. 1 has a first and a second control electrode of first and second conductivity type, respectively. A control signal shown in FIG. 2, is coupled to an input of an inverter 17. An output of inverter 17 provides the complement of a clock signal $\phi$ and is coupled to an input of an inverter 18. Inverter 18 has an output which provides clock signal $\phi$. The output of inverter 18 is coupled to the first control electrode of transmission gate 13 and to the second control electrodes of transmission gates 11 and 12. The complement of clock signal $\phi$ is coupled to the second control electrode of transmission gate 13 and to the first control electrodes of transmission gates 11 and 12.

In operation, each of transmission gates 11, 12 and 13 has associated therewith parasitic capacitance which exists where a control electrode of each transistor overlaps its current electrode. For N-channel transistors this parasitic capacitance is shown in FIG. 1 as $C_N$ and for P-channel transistors is shown as $C_P$. When each of transmission gates 11, 12 and 13 switch in response to the control signal transitioning state, capacitors $C_P$ and $C_N$ couple charge to the input and output of each transmission gate. When an input or output of a conventional transmission gate is coupled to a voltage source or an otherwise low impedance node, the parasitic charge coupling does not cause a substantial error voltage. However, when an input or an output of a conventional transmission gate is coupled to a high impedance, the charge coupling associated with parasitic capacitance causes an error voltage. To compensate for error voltages associated with transmission gates 11 and 12, a transmission gate 13 having its input and output connected together is coupled to transmission gates 11 and 12. Transmission gate 13 compensates for error voltages associated with input terminal 15. It should be readily understood that if output terminal 16 is not connected to a low impedance node and compensation for error voltages at output terminal 16 is also needed, an additional compensating transmission gate (not shown), analogous to transmission gate 13, may be coupled between the outputs of transmission gates 11 and 12 and output terminal 16. The control electrodes of the transistors of transmission gate 13 are clocked by the complement of clock signal $\phi$ and the transistors comprising transmission gates 11, 12 and 13 are all matched devices having proportional control electrode dimensions. Therefore, each parasitic capacitance is substantially equal. The total amount of parasitic capacitance which is coupled to input terminal 15 is $4C_N$ plus $4C_P$. Two of the $C_N$ capacitors are switched by signal $\phi$ and two of the $C_N$ capacitors are switched by the complement of signal $\phi$. Therefore, the net charge injected onto input terminal 15 by the $C_N$ parasitic capacitance when switch 10 is turned off by signal $\phi$ is zero. Similarly, two of the $C_P$ capacitors are switched by signal $\phi$ and two of the $C_P$ capacitors are switched by the complement of signal $\phi$. Therefore, the net charge injected onto input terminal 15 by the $C_P$ parasitic capacitance when composite switch 10 is turned off by the signal signal is zero.

The preceding discussion however assumes that the clock skew between clock signal $\phi$ and its complement is zero. In reality some clock skew, denoted by time t in FIG. 2, always exists. If the complement of clock signal $\phi$ transitions firstly as a result of a transition in the control signal from a high to a low logic level, the N-channel transistor of transmission gate 13 turns on and the P-channel transistors of transmission gates 11 and 12 turn off. However, the charge which the parasitic capacitance associated with the P-channel transistors of gates 11 and 12 is not coupled to input terminal 15. Instead, this charge is removed from input terminal 15 to output terminal 16 since the N-channel transistors of transmission gates 11 and 12 are still conducting by virtue of signal $\phi$ remaining at a high logic level. When signal $\phi$ transitions to a low logic level a finite time, t, later, the P-channel transistor of gate 13 turns on and the N-channel transistors of gates 11 and 12 turn off. This injects charge via parasitic capacitors $C_N$ to input terminal 16 during time t, thus making switch 10 imperfectly compensated.

To overcome error voltage caused by clock skew, it is crucial to recognize the fact that it is critical to turn off transmission gates 11 and 12 instantaneously while turning on transmission gate 13. But it is not critical whether or not transmission gates 11 and 12 are turned on instantaneously with transmission gate 13 turning off. Therefore, the fall time of the control signal driving the N-channel transistors of transmission gates 11 and 12 must be nearly instantaneous with the rise time of the complementary control signal driving the N-channel transistor of transmission gate 13. Similarly, the rise time of the complementary control signal driving the P-channel transistors of transmission gates 11 and 12 must be nearly instantaneous with the fall time of the control signal driving the P-channel transistor of transmission gate 13. Meanwhile, the rise time, the time required to turn a transistor on, of the compensating P-channel transistor of transmission gate 13 must also be nearly instantaneous. Therefore, it is not crucial, with respect to error voltage caused by clock skew, that the compensating N-channel transistor of transmission gate 13 is turned off instantaneously. Neither is it crucial with respect to error voltage caused by clock skew, that transmission gates 11 and 12 turn on instantaneously because there is no error associated with turning transmission gates 11 and 12 on. In applying these principles, the control electrode dimensions of the P-channel transistor of inverter 17 are made very large and the control electrode dimensions of the N-channel transistor of inverter 17 are minimized. In integrated circuit form, the current electrode diffusion of the N-channel transistor of inverter 17 appears as a load capacitance only to the rising edge of the complement of signal $\phi$. Further, the control electrode dimensions of the N-channel transistor of inverter 18 are made very large and the control electrode dimensions of the associated P-channel transistor are made very small. Therefore, the P-channel transistors of transmission gates 11 and 12 are pulled up very quickly and the N-channel transistors of transmission gates 11 and 12 have a fast fall time. The control electrode dimensions of the P-channel transistor of inverter 18 is made small to minimize load capacitance present at output terminal 16. In this manner, clock skew is reduced substantially and error voltages are minimized.

Yet another advantage of the present invention is that as the inverter devices are ratioed according to the preceding paragraph, the switch point voltage of each inverter is changed in a manner to cause each inverter to switch sooner, when transmission gates 11 and 12 are turning off. As a result, clock skew is further minimized.

Figure 3:
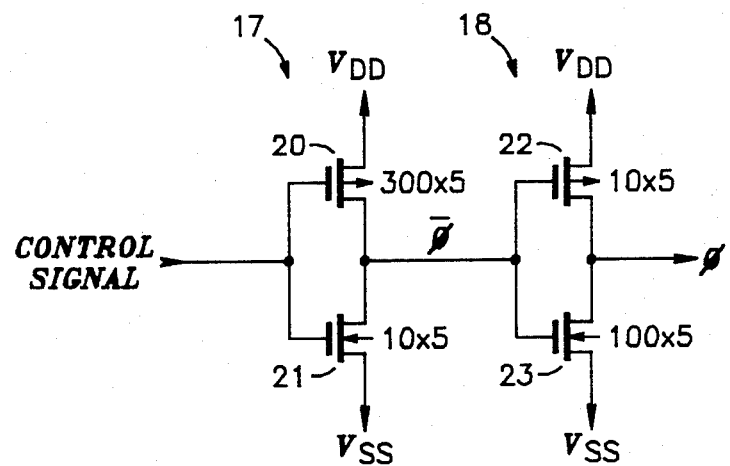
FIG. 3 illustrates in schematic form a preferred embodiment of an input clock means of the switch of FIG. 1.

Shown in FIG. 3 is a schematic diagram of inverters 17 and 18. Inverter 17 comprises a P-channel transistor 20 having a first current electrode coupled to a supply voltage $V_{DD}$, a control electrode coupled to the clock signal, and a second current electrode. An N-channel transistor 21 has a first current electrode coupled to the second current electrodes of transistor 20 for providing the complement of signal $\phi$, a second current electrode coupled to a supply voltage $V_{SS}$, and a control electrode coupled to the clock signal. A P-channel transistor 22 has a first current electrode coupled to supply voltage $V_{DD}$, a control electrode coupled to both the second current electrode of transistor 20 and the first current electrode of transistor 21, and a second current electrode. An N-channel transistor 23 has a first current electrode coupled to the second current electrode of transistor 23, for providing signal $\phi$, a second current electrode coupled to supply voltage $V_{SS}$, and a gate electrode coupled to the control electrode of transistor 22.

In a preferred form, the dimensions of the control electrode of P-channel transistor 20 are 300×5 microns where the width is 300 microns and the length is 5 microns. Similarly, the dimensions of the control electrode of N-channel transistor 21 are 10×5 microns, the dimensions of P-channel transistor 22 are 100×5 microns, and the dimensions of N-channel transistor 23 are 100×5 in a preferred form. However, the ratio of control electrode dimensions may be varied in numerous ways and the invention may be practiced with any ratio where the P-channel transistor of inverter 17 is at least three times larger than the N-channel transistor and the N-channel transistor of inverter 18 is at least three times larger than the P-channel transistor.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

We claim:

1. An MOS analog switch, comprising:
   first, second and third MOS transmission gates, each transmission gate having a transistor of first conductivity type utilizing a first current electrode as an input terminal, a second current electrode as an output terminal, and a control electrode, the input terminals of the first, second and third transmission gates connected together to form an input of said switch, the output terminals of the second and third transmission gates connected together to form an output of said switch, and the output terminal of said first transmission gate connected to both input terminals of said second and third transmission gates; and
   clock means for providing a clock signal to the control electrodes of said second and third transmission gates, and for providing a complement clock signal to the control electrode of said first transmission gate, comprising:
   first inverter means having an input for receiving a control signal, and an output for providing said complement clock signal; and second inverter means having an input coupled to the output of said first inverter means and an output for providing said clock signal, wherein:
   said first and second inverter means have transistors with control electrode dimensions ratioed in a predetermined manner to minimize the delay between said clock signal and its complement.

2. The CMOS analog switch of claim 1 wherein said first inverter means comprise a first MOS transistor of either said first conductivity type or a second conductivity type having a control electrode of predetermined dimensions and a second MOS transistor of opposite conductivity type from said first MOS transistor having a control electrode with dimensions at least three times smaller than the dimensions of the control electrode of said first MOS transistor, and said second inverter means comprise a third MOS transistor of same conductivity type as said first MOS transistor having a control electrode of predetermined dimensions and a fourth MOS transistor of same conductivity type as said second MOS transistor having a control electrode with dimensions at least three times larger than the dimensions of the control electrode of said third MOS transistor.

3. The CMOS analog switch of claim 2 wherein the dimensions of the control electrode of the second MOS transistor of said second conductivity type of said first inverter means are substantially ten times smaller than the dimensions of the control electrode of the first MOS transistor of said first conductivity type of said first inverter means.

4. The CMOS analog switch of claim 2 wherein the dimensions of the control electrode of the fourth MOS transistor of said second conductivity type of said second inverter means are substantially ten times greater than the dimensions of the control electrode of the third MOS transistor of said first conductivity type of said second inverter means.

5. A CMOS analog switch, comprising:
   first, second and third CMOS transmission gates, each CMOS transmission gate having two transistors of opposite conductivity type coupled in parallel to form an input terminal, an output terminal and first and second control electrodes, the input terminals of the first, second and third transmission gates connected together to form an input of said switch, the output terminals of the second and third transmission gates connected together to form an output of said switch, and the output terminal of said first transmission gate connected to both input terminals of said second and third transmission gates; and
   clock means for providing a clock signal to the first control electrode of said first transmission gate and to the second control electrodes of said second and third transmission gates, and for providing a complement clock signal to the second control electrode of said first transmission gate and to the first control electrode of said second and third transmission gates, comprising:
   first inverter means having an input for receiving said clock signal, and an output for providing said complement clock signal; and
   second inverter means having an input coupled to the output of said first inverter means and an output, wherein:
   said first and second inverter means have transistors with control electrode dimensions ratioed in a predetermined manner to minimize the delay between said clock signal and its complement.

6. The CMOS analog switch of claim 5 wherein said first inverter means comprise a first MOS transistor of a first conductivity type having a control electrode of predetermined dimensions and a second MOS transistor of a second conductivity type having a control electrode with dimensions at least three times smaller than the dimensions of the control electrode of said first MOS transistor, and said second inverter means comprise a third MOS transistor of said first conductivity type having a control electrode of predetermined dimensions and a fourth MOS transistor of said second conductivity type having a control electrode with dimensions at least three times larger than the dimensions of the control electrode of said third MOS transistor.

7. The CMOS analog switch of claim 6 wherein the dimensions of the control electrode of the second MOS transistor of said second conductivity type of said first inverter means are substantially ten times smaller than the dimensions of the control electrode of the first MOS transistor of said first conductivity type of said first inverter means.

8. The CMOS analog switch of claim 6 wherein the dimensions of the control electrode of the fourth MOS transistor of said second conductivity type of said second inverter means are substantially ten times greater than the dimensions of the control electrode of the third MOS transistor of said first conductivity type of said second inverter means.

9. A method of compensating for error voltages associated with an analog switch, comprising the steps of:
coupling first and second transmission gates in parallel, said first and second transmission gates each having a transistor with a control electrode of predetermined dimensions, thereby forming an analog switch having an input terminal and an output terminal;
coupling charge compensation means to at least one of the input and output terminals of said analog switch, for charge cancelling error voltages associated with said two transmission gates;
coupling a control signal and the complement thereof to predetermined control electrodes of said two transmission gates and to said charge compensation means via first and second inverter means, each of said inverter means having at least two transistors of first and second conductivity; and
rationing the control electrode dimensions of the two transistors of each of said first and second inverter means by making the control electrode dimensions of the transistor of first conductivity of the first inverter means at least three times greater than the control electrode dimensions of the transistor of the first inverter means of second conductivity, and by making the control electrode dimensions of the transistor of the second inverter means of second conductivity type at least three time greater than the control electrode dimensions of the transistor of the second inverter means of first conductivity type.

10. A composite solid state switch, comprising:
a first transmission gate having a first N-channel transistor with a first current electrode coupled to a first current electrode of a first P-channel transistor, a second current electrode coupled to a second current electrode of said first P-channel transistor, and a control electrode for receiving a control signal, said first P-channel transistor having a control electrode for receiving the complement of said control signal;
a second transmission gate having a second N-channel transistor with a first current electrode coupled to a first current electrode of a second P-channel transistor and to the first current electrodes of said first N-channel and P-channel transistors to form an input terminal of said switch, a second current electrode coupled to a second current electrode of said second P-channel transistor and to the second current electrodes of said first N-channel and P-channel transistors to form an output terminal of said switch, and a control electrode for receiving said control signal, said second P-channel transistor having a control electrode for receiving the complement of said control signal;
a third transmission gate, for compensating for error voltages associated with said first and second transmission gates, having a third N-channel transistor with a first current electrode coupled to a first current electrode of a third P-channel transistor and to said input terminal, a second current electrode coupled to a second current electrode of said third P-channel transistor and to said input terminal, and a control electrode for receiving the complement of said control signal, said third P-channel transistor having a control electrode for receiving said control signal;
a first inverter having an input for receiving a clock signal and an output for providing the complement of said control signal, comprising a fourth P-channel transistor coupled to a fourth N-channel transistor, said fourth P-channel and N-channel transistors having control electrodes of predetermined dimensions wherein the control electrode dimensions of said fourth P-channel transistor is at least three times greater than the dimensions of the control electrode of said fourth N-channel transistor; and
a second inverter having an input for receiving the complement of said control signal and an output for providing said control signal, comprising a fifth P-channel transistor coupled to a fifth N-channel transistor, said fifth P-channel and N-channel transistors having control electrodes of predetermined dimensions wherein the control electrode dimensions of said fifth N-channel transistor is at least three times greater than the control electrode dimensions of said fifth P-channel transistor.

11. The composite solid state switch of claim 10 wherein the control electrode dimensions of the fourth P-channel transistor are substantially ten times larger than the control electrode dimensions of said fourth N-channel transistor.

12. The composite solid state switch of claim 10 wherein the control electrode dimensions of the fifth N-channel transistor are substantially ten times larger than the control electrode dimensions of said fifth P-channel transistor.

* * * * *

UNITED STATES PATENT AND TRADEMARK OFFICE
CERTIFICATE OF CORRECTION

PATENT NO. : 4,508,983

DATED : April 2, 1985

INVENTOR(S) : Robert N. Allgood et al

It is certified that error appears in the above-identified patent and that said Letters Patent is hereby corrected as shown below:

In claim 9, column 7, line 22, change "rationing" to --ratioing--.

Signed and Sealed this

Sixteenth Day of July 1985

[SEAL]

Attest:

DONALD J. QUIGG

Attesting Officer     Acting Commissioner of Patents and Trademarks